United States Patent [19]

Sprengel

[11] Patent Number: 4,580,115
[45] Date of Patent: Apr. 1, 1986

[54] ELECTRICAL SURFACE WAVE FILTER

[75] Inventor: Heinz-Peter Sprengel, Dorfen, Fed. Rep. of Germany

[73] Assignee: Siemens Aktiengesellschaft, Berlin and Munich, Fed. Rep. of Germany

[21] Appl. No.: 701,070

[22] Filed: Feb. 13, 1985

[30] Foreign Application Priority Data

Feb. 29, 1984 [DE] Fed. Rep. of Germany ....... 3407480

[51] Int. Cl.$^4$ ................... H03H 9/145; H03H 9/64
[52] U.S. Cl. ................................. 333/194; 333/151; 333/193
[58] Field of Search ................ 333/150–155, 333/193–196; 310/313 R, 313 A, 313 B, 313 C, 313 D

[56] References Cited

U.S. PATENT DOCUMENTS 4,126,839 11/1978 Yamanoi et al. ................ 333/194
4,344,049 8/1982 Grobe ...................... 333/193 X
4,365,219 12/1982 Nathan ........................ 333/193

OTHER PUBLICATIONS

Siemens, "Oberflaechewillen–Filter LIOB", 1983/84, pp. 37–39.

Primary Examiner—Marvin L. Nussbaum
Attorney, Agent, or Firm—John Francis Moran

[57] ABSTRACT

Electrical surface wave filter with a piezoelectric substrate support which carries on its top side an input and output transducer (14, 15), each electrically connected with a printed circuit via external input and output terminals (22, 23), and fastened by its backside on a metal support (11, 12) which comprises grounding terminals (20) integrally formed in one piece. An arrangement of symetrically disposed grounding terminals (20) eliminates the problem of electric cross-talk between the input and output terminals (22, 23).

3 Claims, 3 Drawing Figures

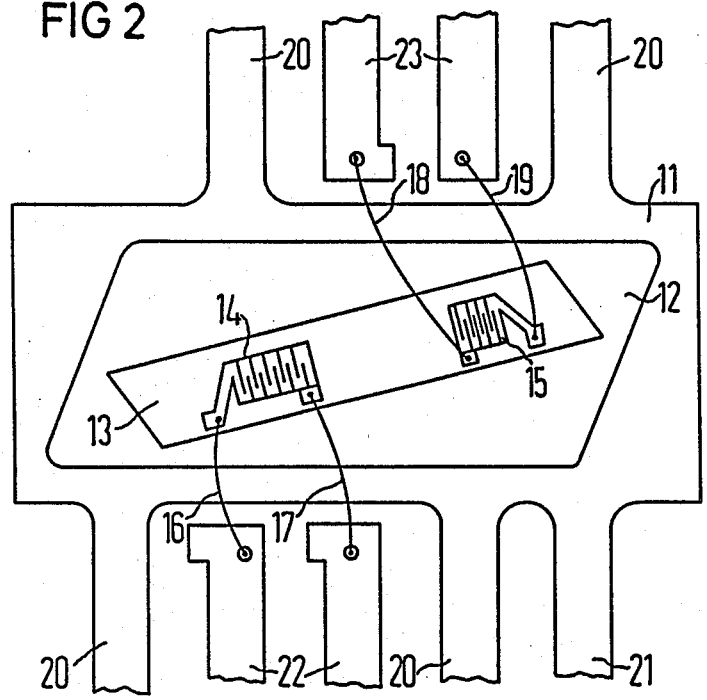
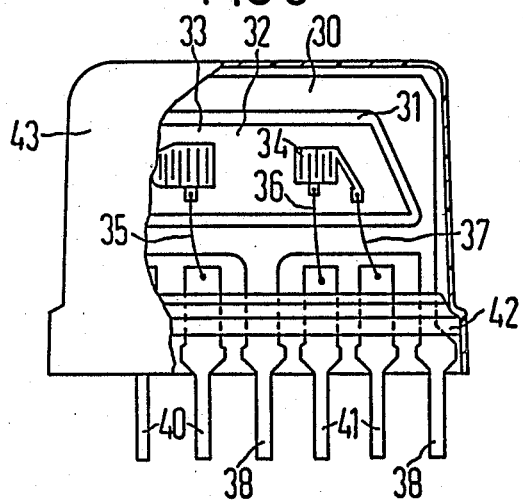

ELECTRICAL SURFACE WAVE FILTER

BACKGROUND OF THE INVENTION

The invention relates to a surface wave filter and, more particularly, the invention relates to such a filter with reduced electrical cross-talk.

Surface wave filters are known e.g. through the data book "Oberflächenwillen-Filter LIOB", edition 1983/84, published by Siemens. They constitute integrated passive structural elements with band filter characteristic, whose operation is based on the interference of mechanical surface waves.

Their construction is typically of the type wherein a monocrystalline, piezoelectric substrate, in particular of lithium niobate, which has an aluminum layer vapor-deposited therein, from which piezoelectric input and output transducers are formed by photoetching. The substrate itself is fastened by glue onto a metal support. The connection of the input and output transducers with the external terminals occurs through bonding wires.

In operation, a signal fed into the input transducer is transformed into a mechanical surface wave which propagates on or in the surface of the substrate to the output transducer. At the output transducer the surface wave is retransformed into an electrical signal. The transducers generally used are interdigital structures with delay effects, which may be provided with a shielding structure. These transducers have highly frequency-dependent properties, so that based on the design of their structures filtering action for electrical signals occurs.

Although these highly desirable filter properties of surface wave filters are obtainable, they suffer from so-called cross-talk. This cross-talk results from signal transmission from the input to the output, produced by excessive electromagnetic coupling between the input and output terminals, and which also bypasses the filtering properties of the filter. In the case of high-frequency signals, with frequencies over a 100 MHz, the inductive component in particular increases greatly, so that the plastic housings presently used are not very suitable for these filters.

The undesirable rf properties of the plastic housings caused by the disadvantageous cross-talk require the utilization of expensive metal housings costly to install and to manufacture, or additional measures such as balanced transformers, shielding plates, and compensations on the circuitboard.

SUMMARY OF THE INVENTION

It is a feature of the present invention to provide an arrangement for reducing electrical cross-talk in surface wave filters of the above-mentioned kind which obviates the problems of plastic housings in particular for these filters.

Broadly, an electrical surface wave filter in accordance with the invention includes a symmetrical arrangement of interconnected grounding terminals for eliminating electrical coupling and cross-talk occurring between the input and output terminals of the filter.

In some of the further aspects of the invention, an additional grounding terminal serves as a key to prevent accidental rotation of the electrical surface wave filter upon insertion into a printed circuit board. Additionally, the grounding terminals and a metal support for the substrate of the filter may be formed from a single metal sheet. A plastic housing may be adapted to fasten to the base while protecting the surface wave filter.

BRIEF DESCRIPTION OF THE DRAWINGS

FIG. 2 is a plan view, in schematic representation partly broken away, of a second embodiment of the invention, showing only the metal support with terminals and the electrically active surface wave part;

FIG. 3 shows in sectional view, partially broken away, a third embodiment of a surface wave filter according to the invention.

Figure 1:
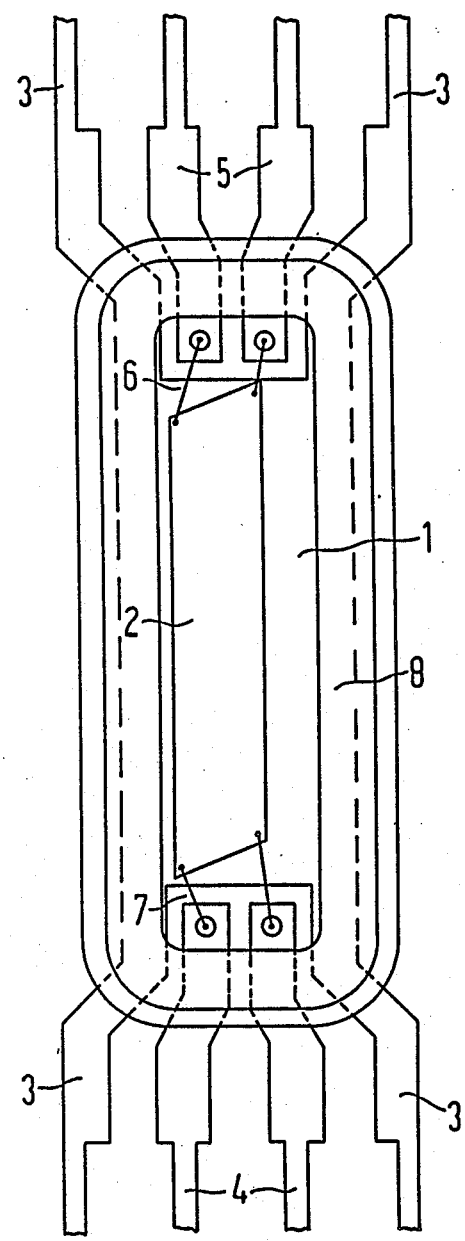
FIG. 1 shows schematically and partly in simplified representation a plan view of a first embodiment of a surface wave filter according to the invention with only one section of the multi-part plastic housing being indicated.

Other features and advantages of the invention will become apparent from the following detailed description and the accompanying drawings.

DETAILED DESCRIPTION

In FIG. 1, metal support 1, stamped out of a copper iron alloy sheet metal for example, and a surface wave filter chip 2 glued onto this metal support. The input and output transducers of this surface wave filter, not shown in the figure in the interest of simplicity, are applied through bonding wire contacts 6, 7 to input and output terminals 4 and 5, respectively, which appropriately are similarly stamped out of the copper iron alloy sheet used for the metal supports. Symmetrically with these input and output terminals grounding terminals 3 or grounding studs are disposed, which are integrally formed in one piece with the metal support 1 or optionally are welded on.

In conjunction with the mass of the circuitboard, not shown in the drawing, the grounding terminals 3 act as a shortcircuit loop. The currents induced in the grounding terminals reduce the fields produced by the input and output currents and thereby diminish the coupling between input 4 and output 5. Moreover, the currents flowing from the surface wave filter chip 2 via the metal support 1 and the grounding terminals 3 to the circuitboard are evenly and symmetrically divided, which likewise suppresses the coupling of the input voltage into the output circuit.

FIG. 1 shows simply groove 8 adapted to accept a duroplastic material as part of the plastic housing. This groove is formed in the underside of the metal support 1 and rests by its sidewall 6 on the edge surfaces of the top of the metal support 1, so that the metal support 1 and all terminals are firmly fixed in groove 8.

Over this groove is cupped a domed-shaped cover of duroplastic material, not shown, and the entire arrangement, consisting of groove 8 and the respective cover, is clad with a sheath of duroplastic material also not shown.

In the embodiment according to FIG. 2, the metal support 11 has a recessed part 12 onto which a surface wave filter chip 13 is glued. The input and output transducers 14 and 15 are contacted by means of bonding wire contacts 16, 17 and 18, 19, respectively, with input and output terminals 22 and 23. Symmetrically with these terminals, grounding terminals 20 or grounding studs are arranged, which are connected with the metal support 11 in particular in one piece. To provide a key for preventing accidental rotation while inserting this surface wave filter into printed circuits, the metal support 11 has an additional grounding stud 21.

In the embodiment according to FIG. 3, grounding terminals 38 is only oriented symmetrically with the output terminals 41. The filter also includes metal support 30, the recessed part 31 on which a surface wave filter chip 32 is glued. The input and output transducers 33, 34 of the chip are connected through bonding wire contacts 35 or 36, 37 with the input and output terminals 40 and 41, respectively.

The ends of all terminals are extended through base 42 of duroplastic material, on which rests a plastic cap 43.

Those skilled in the art will understand that changes can be made in the preferred embodiments here described, and that these embodiments can be used for other purposes. Such changes and uses are within the scope of the invention, which is limited only by the claims which follow.

What is claimed is:

1. An electrical surface wave filter in a package adapted to connect with a printed circuit comprising: a metal support and a piezoelectrical substrate fastened to the metal support, an input transducer and an output transducer located on the unattached surface of the substrate, a first pair of terminals electrically connected to the input transducer and a second pair of terminals connected to the output transducer, the terminals being electrically insulated from the metal support, the terminals providing electrical connection to the printed circuit, grounding terminals formed as extensions of the metal support serving to prevent electrical cross-talk between the pairs of terminals, the grounding terminals being arranged symmetrically with respect to each pair of terminals and being designed for contacting with a common conductive portion of the printed circuit, and the grounding terminals and the metal support providing a short-circuit loop in conjunction with a conductive path provided by the common conductive portion of the printed circuit around each pair of terminals of the filter.

2. A surface wave filter according to claim 1, wherein the metal support includes an additional grounding terminal located in a manner which allows that the surface wave filter to be inserted into the printed circuit in only one predetermined orientation.

3. A surface wave filter according to claim 1 or claim 2, wherein a plastic cover is adapted to fit over the metal support of the surface wave filter as an enclosure.

* * * * *